United States Patent
Herrmann (10) Patent No.: US 9,281,425 B2
(45) Date of Patent: Mar. 8, 2016

(54) METHOD FOR PRODUCING AN OPTOELECTRONIC SEMICONDUCTOR COMPONENT AND SUCH A SEMICONDUCTOR COMPONENT

(75) Inventor: Siegfried Herrmann, Neukirchen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/122,513

(22) PCT Filed: May 14, 2012

(86) PCT No.: PCT/EP2012/058921
§ 371 (c)(1),
(2), (4) Date: Jan. 23, 2014

(87) PCT Pub. No.: WO2012/168040
PCT Pub. Date: Dec. 13, 2012

(65) Prior Publication Data
US 2014/0151724 A1 Jun. 5, 2014

(30) Foreign Application Priority Data
Jun. 6, 2011 (DE) .......................... 10 2011 103 412

(51) Int. Cl.
*H01L 31/0236* (2006.01)
*H01L 33/22* (2010.01)
(Continued)

(52) U.S. Cl.
CPC ............ *H01L 31/0236* (2013.01); *H01L 24/18* (2013.01); *H01L 24/19* (2013.01); *H01L 24/96* (2013.01); *H01L 31/18* (2013.01); *H01L 33/22* (2013.01); *H01L 33/48* (2013.01); *H01L 33/62* (2013.01); *H01L 25/0753* (2013.01); *H01L 33/486* (2013.01); *H01L 2224/04105* (2013.01); *H01L 2224/24137* (2013.01); *H01L 2224/92144* (2013.01); *H01L 2924/15787* (2013.01); *H01L 2933/0033* (2013.01); *H01L 2933/0066* (2013.01)

(58) Field of Classification Search
CPC ..... H01L 33/48; H01L 33/483; H01L 33/486; H01L 31/18; H01L 24/18; H01L 23/481; H01L 25/0753
USPC .................... 438/27, 65, 26, 64; 257/88, 443
See application file for complete search history.

(56) References Cited

U.S. PATENT DOCUMENTS

| 7,276,724 B2 * | 10/2007 | Sheats ................. H01L 31/0392 257/21 |
| 2004/0222433 A1 | 11/2004 | Mazzochette et al. |

(Continued)

FOREIGN PATENT DOCUMENTS

| CN | 201804913 U | 4/2011 |
| DE | 102009032486 A1 | 1/2011 |

(Continued)

*Primary Examiner* — Julio J Maldonado
*Assistant Examiner* — Moazzam Hossain
(74) *Attorney, Agent, or Firm* — Slater & Matsil, L.L.P.

(57) ABSTRACT

A method for producing a semiconductor component is disclosed. A carrier substrate includes a mounting region and an opening, which is formed in the mounting region of the carrier substrate. After mounting a semiconductor chip, an electrically insulating layer is applied to the carrier substrate in such a way that the electrically insulating layer completely fills the first opening in the carrier substrate. A second opening is formed in the electrically insulating layer. An electrically conductive layer is then applied to the electrically insulating layer in such a way that the second opening is filled with the electrically conductive layer in the form of a via. A semiconductor component produced in this way is also provided.

12 Claims, 4 Drawing Sheets

(51) Int. Cl.
*H01L 21/00* (2006.01)
*H01L 27/146* (2006.01)
*H01L 33/62* (2010.01)
*H01L 23/00* (2006.01)
*H01L 31/18* (2006.01)
*H01L 25/075* (2006.01)
*H01L 33/48* (2010.01)

(56) References Cited

U.S. PATENT DOCUMENTS

2006/0006404 A1* 1/2006 Ibbetson et al. ............... 257/99
2009/0121249 A1 5/2009 Tseng et al.
2009/0189179 A1 7/2009 Wen et al.
2010/0001395 A1 1/2010 Wang et al.
2010/0032830 A1* 2/2010 Chang et al. ............... 257/737
2010/0123162 A1* 5/2010 Kondo et al. ............... 257/99
2011/0006322 A1 1/2011 Li et al.
2011/0220925 A1* 9/2011 Greenwood ............... 257/91
2012/0098025 A1* 4/2012 Hoppel ............... 257/99

FOREIGN PATENT DOCUMENTS

EP 2219241 A1 8/2010
WO 2011003907 A1 1/2011

* cited by examiner

METHOD FOR PRODUCING AN OPTOELECTRONIC SEMICONDUCTOR COMPONENT AND SUCH A SEMICONDUCTOR COMPONENT

This patent application is a national phase filing under section 371 of PCT/EP2012/058921, filed May 14, 2012, which claims the priority of German patent application 10 2011 103 412.2, filed Jun. 6, 2011, each of which is incorporated herein by reference in its entirety.

TECHNICAL FIELD

The invention relates to a method for producing an optoelectronic component comprising a carrier substrate and a semiconductor chip. The present invention further relates to such an optoelectronic semiconductor component.

BACKGROUND

When producing semiconductor components with thin semiconductor chips, which inter alia comprise unilateral electrical contacting, precise adjustment processes are necessary in order to mount the semiconductor chip on carrier substrates. For example, in the case of a semiconductor chip which comprises annular insulation between the p- and n-contact regions of the semiconductor chip, the annular region is free-standing and not supported mechanically by the carrier substrate. Such a mechanically unsupported region for separating the unilateral electrical contacts disadvantageously leads to lower mechanical stability and thus to a susceptibility to damage caused by external mechanical influences.

SUMMARY OF THE INVENTION

Embodiments of the present invention provide a production method that avoids the above-stated disadvantages, resulting advantageously in a mechanically robust semiconductor component. The production method at the same time enables simplified chip adjustment.

In one embodiment, the method for producing an optoelectronic semiconductor component comprises the following method steps:

A1) providing at least one semiconductor chip which comprises an active layer suitable for generating radiation, A2) providing a carrier substrate which comprises at least one mounting region for the semiconductor chip and at least one first opening, which is formed in the mounting region of the carrier substrate, B) mounting the semiconductor chip on the mounting region of the carrier substrate, C) applying an electrically insulating layer to the side of the carrier substrate remote from the semiconductor chip in such a way that the electrically insulating layer completely fills the first opening in the carrier substrate, D) forming at least one second opening in the electrically insulating layer, the second opening being formed in the region of the first opening in the carrier substrate, and E) applying an electrically conductive layer on the side of the electrically insulating layer remote from the carrier substrate in such a way that the electrically conductive layer fills the second opening in the electrically insulating layer in the form of a via.

The production method advantageously enables simplified chip adjustment and whole-area mechanical support of the semiconductor chip by the carrier substrate and the electrically insulating layer. In particular, the first opening of the carrier substrate is filled with the electrically insulating layer and thus serves to provide mechanical support for the semiconductor chip. The second opening serves to produce an electrically conductive contact through the electrically insulating layer, the electrically conductive layer being passed through said opening. The precision requirements associated with chip adjustment, i.e., with arrangement of the semiconductor chip on the mounting region of the carrier substrate, may advantageously be reduced, since the contact via through the carrier substrate is completely lined with the electrically insulating layer. Larger substrates than is conventional may advantageously be used for such a production process, it preferably additionally being possible to form these substrates of an inexpensive material. Due to the electrically insulating layer, good external thermal coupling of the semiconductor component is also possible.

Method steps A1) and A2) may be performed in parallel or in succession. Method steps B) to E) may then be performed in the recited sequence.

Once method steps A) to E) have been performed, the semiconductor chip is arranged on a carrier, which is formed by the carrier substrate, the electrically insulating layer and the electrically conductive layer. In particular, the electrically insulating layer extends in a lateral direction on the side of the carrier substrate remote from the semiconductor chip. The electrically conductive layer likewise extends in the lateral direction on the side of the electrically insulating layer remote from the carrier substrate. The carrier is thus formed of a multilayer structure, with openings and vias passing vertically through each of said layers.

The semiconductor chip is mounted on the mounting region of the carrier substrate, in particular, prior to application of the electrically insulating layer into the first opening. In addition, mounting of the semiconductor chip on the mounting region of the carrier substrate proceeds in particular prior to formation of the second opening in the electrically insulating layer. In other words, the semiconductor chip may at least in places be in direct contact with the mounting region and/or the via of the carrier substrate, wherein the mounting region of the carrier substrate is free of the electrically insulating layer and the electrically conductive layer.

The electrically conductive layer preferably completely fills the second opening in the electrically insulating layer. The first opening in the carrier substrate is thus filled with the electrically insulating layer and the second opening is completely filled with the electrically conductive layer, such that the carrier substrate comprises a flat, planar major face comprising the mounting region.

The semiconductor component is an optoelectronic component, which allows the conversion of electrically generated data or energy into light emission or vice versa. The optoelectronic semiconductor chip is for example a radiation-emitting semiconductor chip, for example, an LED.

The active layer of the semiconductor chip preferably contains a pn-junction, a double heterostructure, a single quantum well (SQW) or a multi quantum well structure (MQW) for radiation generation. The term quantum well structure does not here have any meaning with regard to the dimensionality of the quantization. It encompasses inter alia quantum troughs, quantum wires and quantum dots and any combination of these structures.

The semiconductor chip is preferably composed of an epitaxially grown semiconductor layer sequence, which contains the active layer. The semiconductor layers of the semiconductor layer sequence preferably contain a III/V semiconductor material. III/V semiconductor materials are particularly suitable for generating radiation in the ultraviolet, through the visible to the infrared spectral range. The semiconductor chip may comprise a growth substrate, on which the semiconductor layer sequence has been grown in the production method.

According to at least one embodiment, the semiconductor chip comprises two mutually electrically insulated electrical contact regions on the side facing the carrier substrate, the first and the second openings being formed in a region vertically adjacent to one of the two contact regions.

One of the electrical contact regions of the semiconductor chip is accordingly arranged vertically over the first and second openings. In this way, a via may be passed through the openings to bring the electrically conductive layer into contact with said contact region of the semiconductor chip. The second contact region of the semiconductor chip may be electrically contacted, for example, by way of the carrier substrate, which is completely separated electrically from the electrically conductive layer by means of the electrically insulating layer. Alternatively, the second contact region may likewise be electrically contactable by means of a via through the carrier.

The semiconductor chip thus comprises unilateral contacting. The side of the semiconductor chip remote from the carrier substrate thus does not comprise an electrical contact region, such that this side achieves efficient radiation outcoupling, advantageously without the occurrence of shading or absorption effects.

Unilateral contacting on the side of the semiconductor chip facing the carrier substrate may be brought about for example by means of an annular contact. Annular insulation may, for example, be used here between a p- and an n-contact region of the semiconductor chip.

According to at least one embodiment, the diameter of the second opening is smaller than the diameter of the first opening. The smaller size of the first opening ensures improved mechanical, whole-area support of the semiconductor chip by the carrier. The second opening is here punctiform, such that only a small central region of the first opening is not filled with the electrically insulating layer and thus only a small region does not contribute to mechanical support of the semiconductor chip. By lining the first opening with the electrically insulating layer, it is advantageously additionally possible to reduce the chip adjustment-related precision requirements.

According to at least one embodiment, the first opening has a diameter of at least 70 μm and at most 90 μm and the second opening has a diameter of at least 10 μm and at most 30 μm. The first opening is thus more than twice as large as the second opening.

According to at least one embodiment, the second opening is formed at least in part in the first opening. The second opening accordingly passes at least in part through the first opening. In this way, a via consisting of material of the electrically conductive layer may be produced from the side of the carrier substrate remote from the semiconductor chip to the contact region of the semiconductor chip.

According to at least one embodiment, the via is punctiform. In particular, the second opening is made as small as possible, such that the carrier provides the semiconductor chip with the greatest possible mechanical support. The second opening is designed to be of a suitable size to produce a sufficiently electrically conductive connection between the electrically conductive layer and one of the contact regions of the semiconductor chip.

According to at least one embodiment, after method step E) the electrically conductive layer is patterned. Beneath each of the contact regions of the semiconductor chip, for example, a first and a second opening are arranged, the electrically insulating layer being formed in each first opening and the electrically conductive layer in each second opening in the form of a via. In this case, the electrically conductive layer is patterned in such a way that the vias are insulated electrically from one another by the patterning.

According to at least one embodiment, the production method comprises one or more of the further method steps after method step E):
roughening a coupling face of the semiconductor chip, which is located opposite the carrier substrate,
applying a converter layer and/or a passivation layer to the opposite side of the semiconductor chip from the carrier substrate, and/or
thinning or complete detachment of a growth substrate of the semiconductor chip.

The converter layer is here preferably suitable for converting radiation emitted by the semiconductor chip into radiation of a different wavelength.

According to at least one embodiment, a plurality of semiconductor chips is provided in method steps A1) and A2), the carrier substrate comprising a plurality of mounting regions for the semiconductor chips and a plurality of first openings. In method step B), in each case one of the semiconductor chips is arranged in each case on one of the mounting regions. In method step D), a plurality of second openings are formed in the electrically insulating layer, in each case one of the second openings being formed in the region of in each case one of the first openings in the carrier substrate.

Thus, in the present case a semiconductor component is produced which comprises a plurality of semiconductor chips which can be connected electrically conductively by means of vias through the carrier substrate. The electrically insulating layer is here placed under each of the semiconductor chips to provide mechanical chip support.

According to at least one embodiment, after method step E) the semiconductor component is then singulated into individual semiconductor chips and/or semiconductor chip modules. A semiconductor chip module is considered in particular to be a module comprising a plurality of semiconductor chips connected together, for example, in series.

According to at least one embodiment, in method step B) the semiconductor chips are mounted on the mounting regions of the carrier substrate using a pick-and-place method. By lining the first opening with the electrically insulating layer, less stringent requirements advantageously apply with regard to the precision of chip adjustment.

The openings in the carrier substrate and/or in the electrically insulating layer are generated, for example, by means of a controlled laser. To form the via in the second opening, the electrically insulating layer is for example lined with a metal layer, the vias being produced galvanically with the contact regions of the semiconductor chip.

According to at least one embodiment, the optoelectronic semiconductor component comprises at least one semiconductor chip and one carrier substrate, the semiconductor chip comprising an active layer suitable for generating radiation. The carrier substrate comprises at least one mounting region for the semiconductor chip and at least one first opening, which is formed in the mounting region. The semiconductor chip is arranged on the mounting region of the carrier substrate. On the side of the carrier substrate remote from the semiconductor chip, an electrically insulating layer is applied which fills the first opening in the carrier substrate. A second opening is formed in the electrically insulating layer in the region of the first opening in the carrier substrate. An electrically conductive layer is applied on the side of the electrically insulating layer remote from the carrier substrate, the electrically conductive layer filling the second opening in the electrically insulating layer in the form of a via.

The semiconductor chip of the component thus comprises unilateral chip contacting, facing the carrier substrate. The vias through the carrier substrate and the electrically insulating layer enable electrical contacting of the semiconductor chip. The carrier substrate preferably comprises at least two first openings, which are each arranged beneath one of the contact regions of the semiconductor chip. The electrically insulating layer preferably comprises two second openings, which are each arranged in one of the first openings. The second openings are each completely filled with material from the electrically conductive layer.

The features listed in relation to the production method also find application in connection with the semiconductor component and vice versa.

According to at least one embodiment, the side of the carrier substrate facing the semiconductor chip has no electrically insulating layer. In this case, no material from the electrically insulating layer is arranged on the side of the carrier substrate facing the semiconductor chip. The side of the carrier substrate facing the semiconductor chip is neither contaminated nor covered by the material of the electrically insulating layer, nor does it comprise traces of the electrically insulating material. This means that the semiconductor chip may be mounted on the carrier substrate in particular without previous cleaning and/or removal of the electrically insulating material. The semiconductor chip is in direct contact with the carrier substrate.

According to at least one embodiment, the carrier substrate is a metal foil or a ceramic foil. An example of a metal foil which may be used is a molybdenum foil.

The carrier substrate is preferably covered on the back with the electrically insulating layer, the electrically insulating layer in this case completely lining the first openings in the carrier substrate, such that the semiconductor chip is supported mechanically over its entire area.

According to at least one embodiment, the electrically insulating layer is a plastic layer, preferably a plastic foil.

According to at least one embodiment, the carrier substrate, the electrically insulating layer and/or the electrically conductive layer each take the form of a foil.

Two openings are opened up in punctiform manner in the electrically insulating layer, for example, using a laser, such that in each case a chip contact region is exposed. Only the region indirectly below the chip contact region is opened up, such that the remaining region of the first opening in the carrier substrate is still filled with the electrically insulating layer and so serves to provide mechanical support for the semiconductor chip. The via in the electrically conductive layer ensures external electrical contacting of the component.

According to at least one embodiment, a semiconductor component according to the invention, comprising a plurality of semiconductor chips, is used as screen backlighting or as a series-connected module for lateral incoupling into light distribution panels.

BRIEF DESCRIPTION OF THE DRAWINGS

Further advantages and advantageous further developments of the invention are revealed by the exemplary embodiments described below in conjunction with the figures, in which.

In the figures, identical or identically acting components may in each case be provided with the same reference numerals. The components illustrated and their size ratios to one another should not be viewed as being to scale. Rather, individual elements such as, for example, layers, structures, components and regions are shown exaggeratedly thick or large for greater ease of depiction and/or better comprehension.

DETAILED DESCRIPTION OF ILLUSTRATIVE EMBODIMENTS

Figure 1A:
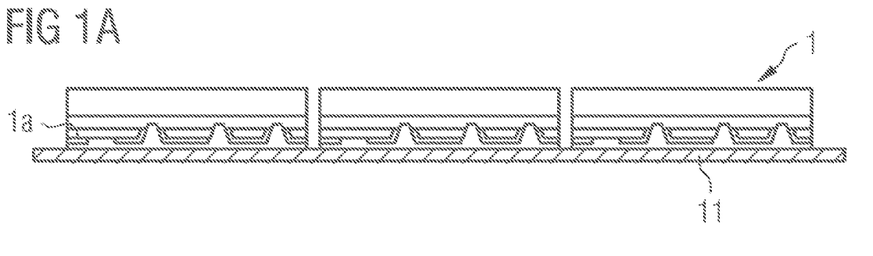
FIGS. 1A to 1K each show a schematic cross-section of an exemplary embodiment of a semiconductor component according to the invention in the process of being produced.

FIGS. 1A to 1K in each case show cross-sections of a semiconductor component in process of being produced. In FIG. 1A a substrate 11 is provided, on which a plurality of semiconductor chips 1 are arranged. The substrate 11 preferably takes the form of a foil. The semiconductor chips 1 each comprise an active layer 1a suitable for generating radiation. The semiconductor chips 1 are LEDs, for example, and preferably exhibit unilateral contacting, so meaning that the semiconductor chips 1 each have both contact regions on the same side. The contact regions of the semiconductor chips 1 are, for example, arranged on the side facing the substrate 11. In this case, the side of the semiconductor chips 1 remote from the substrate 11 does not have any contact regions. This side is accordingly suitable for radiation outcoupling, this making it possible to avoid absorption losses, for example, in the contact regions on this side.

Figure 1B:
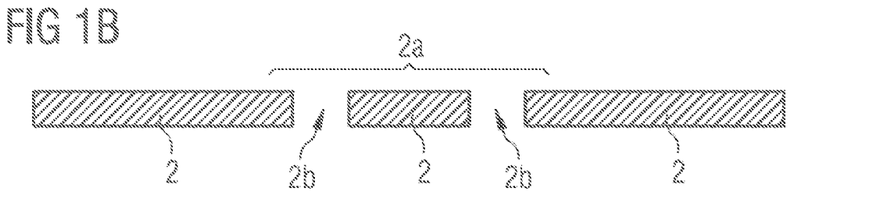

In parallel or thereafter, a carrier substrate 2 is provided, as shown in FIG. 1B. The carrier substrate 2 comprises at least one mounting region 2a for at least one semiconductor chip 1. In addition, the carrier substrate 2 comprises two first openings 2b, which are formed in the mounting region 2a of the carrier substrate 2. The carrier substrate 2 preferably comprises a material conformed thermally to the material of the semiconductor chip. The carrier substrate 2 is, for example, a molybdenum foil or an $Al_2O_3$ ceramic substrate. The carrier substrate 2 preferably takes the form of a foil. The first openings 2b in the carrier substrate 2 are produced, for example, by means of laser drilling, etching or by means of a punching process.

Figure 1C:
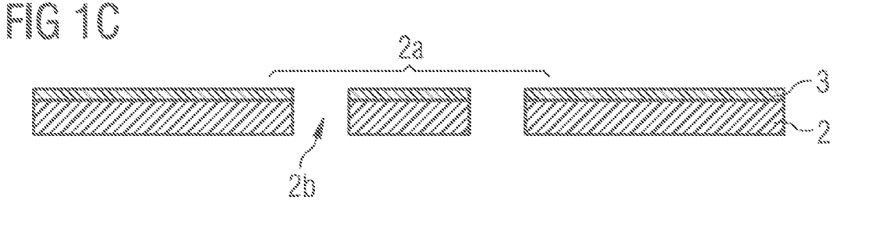

A solder layer 3 is applied to the carrier substrate 2 in the next method step, the first openings 2b again being left open (see FIG. 1C). The solder layer 3 has as its material, for example, a metal or a metal alloy which is suitable for a soldering process.

Figure 1D:
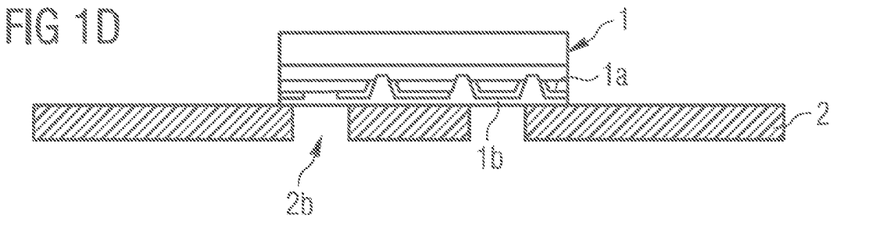

In the next method step, as shown in FIG. 1D, the semiconductor chip 1 is detached from the substrate 11 and applied to the mounting region of the carrier substrate 2. To mount the semiconductor chip 1, the latter is soldered to the mounting region of the carrier substrate 2. The first openings 2b are then arranged vertically beneath the semiconductor chip 1. In particular, a first opening 2b is formed in each case in a contact region of the semiconductor chip 1. "Beneath" in particular means that the first opening 2b is formed in each case vertically adjacent the semiconductor chip 1. Transfer of the semiconductor chip 1 from the substrate 11 onto the carrier substrate 2 proceeds, for example, using a pick-and-place method.

Figure 1E:
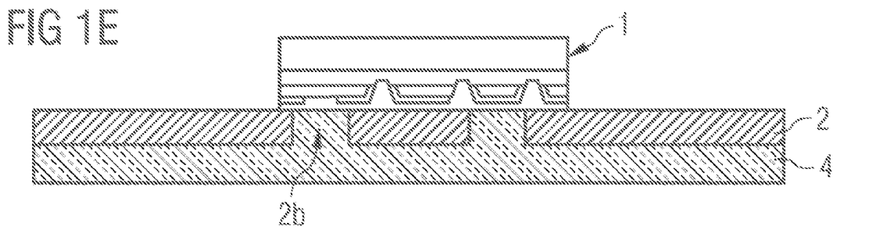

As shown in FIG. 1E, an electrically insulating layer 4 is applied to the side of the carrier substrate 2 remote from the semiconductor chip 1. The electrically insulating layer is applied in such a way that the first openings 2b in the carrier substrate 2 are filled completely with material from the electrically insulating layer 4. The carrier substrate 2 and the electrically insulating layer 4 then form a flat main face on the side facing the semiconductor chip 1. In the region of the first openings 2b, the electrically insulating layer 4 accordingly directly adjoins the contact regions of the semiconductor chip 1.

The electrically insulating layer 4 is preferably a plastic foil, for example, a layer comprising parylene or polymer or an RCC material. The electrically insulating layer is applied to the carrier substrate 2, for example, by means of a vacuum lamination process.

Figures 1F, 1G:
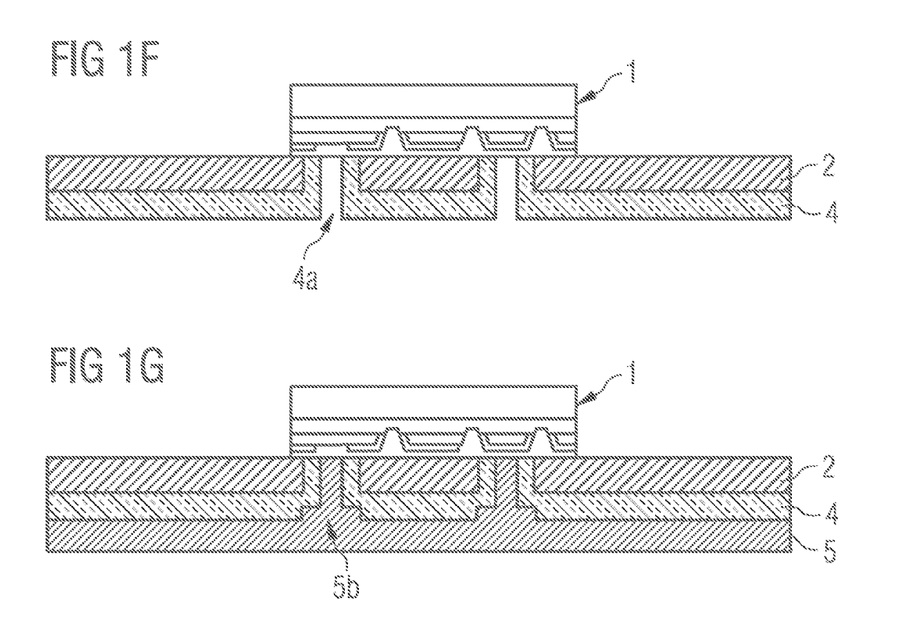

As shown in FIG. 1F, two second openings 4a are then formed in the electrically insulating layer 4, the second openings each being formed in a region in each case of a first opening in the carrier substrate. The second openings 4a are accordingly each formed in the first opening of the carrier substrate. The second openings 4a then pass completely through the electrically insulating layer 4 in the region of the first opening, such that in each case the contact regions of the semiconductor chip 1 are at least partially free of the electrically insulating layer. The second openings are formed in punctiform manner in the electrically insulating layer, such that only the contact region of the semiconductor chip is revealed in each case. Opening up proceeds, for example, using a controlled laser, whereby advantageously only the region directly beneath the semiconductor contact region can be opened up. The remainder of the first opening remains filled with the material of the electrically insulating layer 4 and thus advantageously continues to provide mechanical support for the semiconductor chip.

The diameter of the second opening 4a is in each case smaller than the diameter of the first opening in the carrier substrate.

Figure 2A:
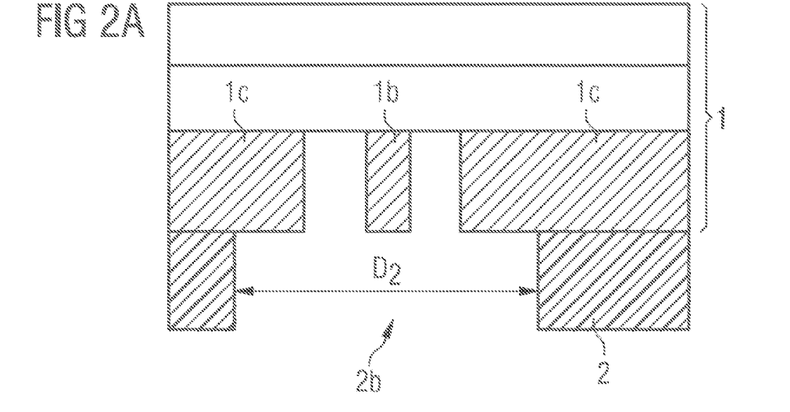
FIGS. 2A to 2C each show portions of a semiconductor component according to the invention in the process of being produced.
Figure 2B:
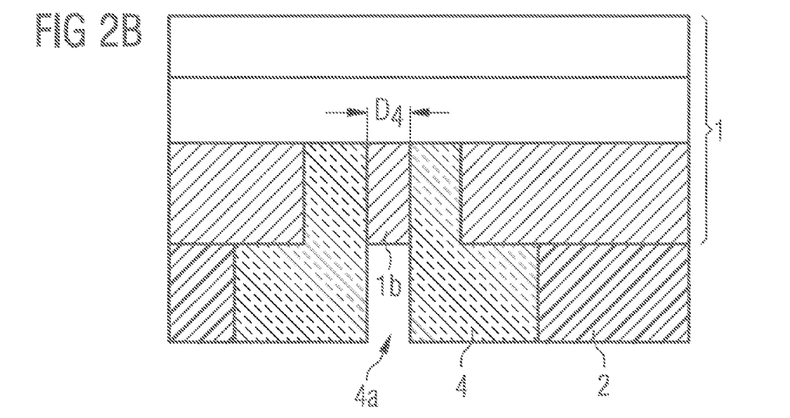
Figure 2C:
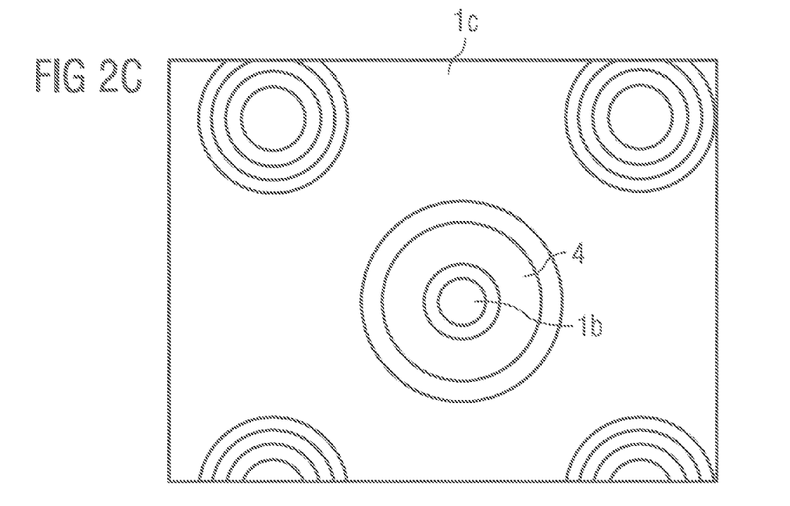

Application of the electrically insulating layer and formation of the second openings in the electrically insulating layer are explained in greater detail in relation to FIGS. 2A to 2C.

As illustrated in the exemplary embodiment shown in FIG. 1G, in the next method step an electrically conductive layer 5 is applied to the side of the electrically insulating layer 4 remote from the carrier substrate 2. The electrically conductive layer 5 is applied such that, in the second openings in the electrically insulating layer 4, vias 5b are formed from the material of the electrically conductive layer 5. The second openings are preferably completely filled with material from the electrically conductive layer 5. In this way, the side of the carrier substrate 2 facing the semiconductor chip 1 may again be provided with a flat face.

The carrier substrate 2, the electrically insulating layer 4 and the electrically conductive layer 5 together form a carrier for the semiconductor chip 1. The various layers 2, 4, 5 of the carrier may each take the form of a foil. For example, the electrically conductive layer 5 is formed of a metal seed layer, the vias 5b being produced by electrodeposition and in this way enabling electrical contact with the contact regions of the semiconductor chip 1.

The electrically conductive layer 5 is, for example, a copper layer, preferably a copper foil.

Figure 1H:
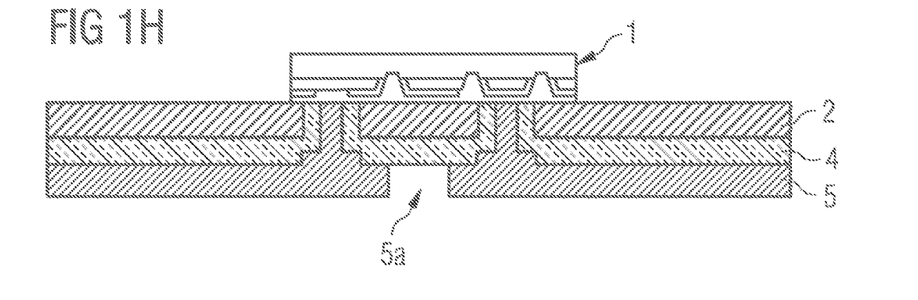

In the next method step, as shown in FIG. 1H, the electrically conductive layer 5 is patterned. In particular, the electrically conductive layer 5 is subdivided into two regions, which are spatially and electrically separated from one another by a gap. Each region comprises a via, such that the contact regions of the semiconductor chip 1 are electrically contactable separately from one another and are electrically insulated from one another. The regions are separated by the patterning 5a, which takes the form of an opening or hole.

In addition, in the method step of FIG. 1H a growth substrate, on which the semiconductor layer sequence of the semiconductor chip 1 was grown and which is applied to the side of the semiconductor chip 1 remote from the carrier substrate 2, is completely detached. The semiconductor chip 1 is thus a thin-film semiconductor chip. Alternatively, just part of the growth substrate may be removed by thinning.

Figure 1I:
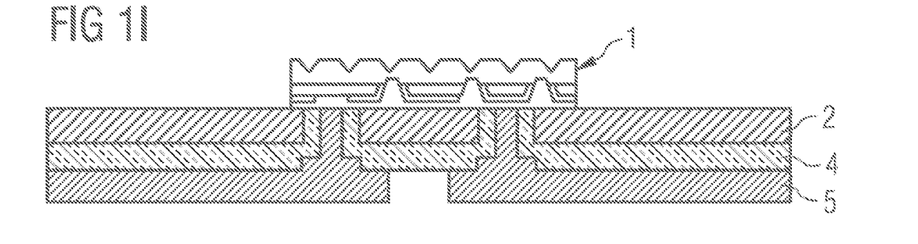

In the method step illustrated in FIG. 1I the side of the semiconductor chip 1 remote from the carrier substrate 2 is then roughened. This roughening advantageously increases the radiation outcoupling efficiency of the semiconductor chip.

Figure 1J:
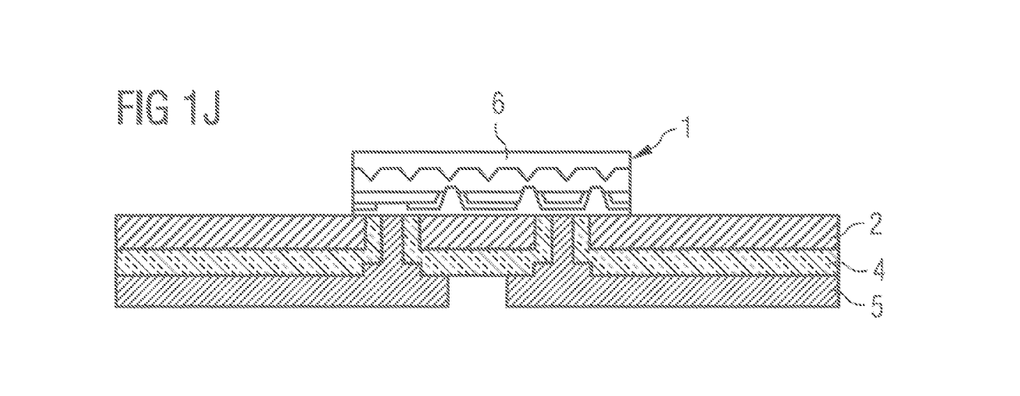

A passivation layer 6 is then applied to the roughened surface of the semiconductor chip 1, as shown in FIG. 1J. The passivation layer 6 provides the semiconductor chip 1 with a planar outcoupling face.

A converter layer 7 may then be applied to the carrier substrate 2 and to the semiconductor chip 1 on the opposite side from the carrier substrate 2. The converter layer 7 is, for example, laminated onto the carrier substrate and the semiconductor chip. The converter layer 7 is in particular suitable for converting at least part of the radiation emitted by the semiconductor chip 1 during operation into radiation of a different wavelength range.

Figure 1K:
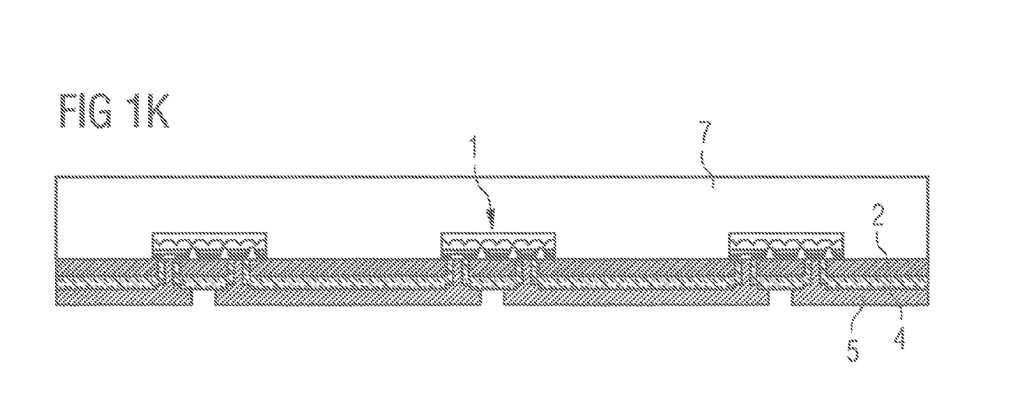

The method steps in FIGS. 1A to 1J may also be performed simultaneously for a plurality of semiconductor chips 1, as indicated in FIG. 1K. In this case, a plurality of mounting regions and a plurality of first openings are provided respectively on or in the carrier substrate in the method step in FIGS. 1B and 1C. In the method step shown in FIG. 1D one semiconductor chip is then arranged on each mounting region. Two first openings are formed in each case beneath each semiconductor chip. Then, after application of the electrically insulating layer 4 (as shown in FIG. 1E) second openings are formed in each case beneath each semiconductor chip 2, as shown by way of example, for one semiconductor chip in FIG. 1F. Then, a plurality of second openings are formed in the electrically insulating layer, these being filled in the form of vias by the electrically conductive layer 5, such that each semiconductor chip can be electrically contacted externally.

The assembly of semiconductor components, as shown in FIG. 1K, may then be singulated to yield individual semiconductor chips or semiconductor chip modules. Semiconductor components produced in this way are used, for example, for screen backlighting or as a series-connected module for lateral incoupling into light distribution panels.

FIGS. 2A to 2C show in greater detail the method steps involved in applying the electrically insulating layer and forming the second opening in the electrically insulating layer 4. Here the semiconductor chip 1 comprises an annular contact on the side facing the carrier substrate 2. In this case, one contact region 1b of the semiconductor chip 1 is surrounded annularly by a second contact region 1c, an annular gap being formed between the first contact region 1b and the second contact region 1c. The first opening 2b in the carrier substrate 2 is vertically directly beneath the first contact region 1b and the annular opening. The first opening 2b comprises, for example, a diameter D2 of at least 70 µm and at most 90 µm, as shown in FIG. 2A.

As shown in FIG. 2B, the electrically insulating layer 4 is then arranged in the first opening in the carrier substrate 2. The material of the electrically insulating layer 4 additionally fills the annular opening between the contact regions of the semiconductor chip 1. The second opening in the electrically insulating layer 4 is formed vertically directly beneath the first contact region 1b of the semiconductor chip 1. The diameter D4 of the second opening 4a is thus conformed, for example, to the extent of the first contact region 1b of the semiconductor chip 1. For example, the second opening 4a comprises a diameter D4 of at least 10 µm and at most 30 µm. The second opening is accordingly smaller than the first opening in the carrier substrate and arranged in the first opening.

The via is then formed in the second opening 4a by means of the material of the electrically conductive layer (not shown).

FIG. 2C shows a view from below of the semiconductor chip of the exemplary embodiment shown in FIG. 2B. The first contact region 1b of the semiconductor chip is surrounded annularly by the material of the electrically insulating layer 4. The electrically insulating layer 4 is in turn surrounded by the second contact region 1c of the semiconductor chip, such that the electrically insulating layer 4 separates the first contact region 1b and the second contact region 1c spatially and electrically from one another.

The invention is not limited to the exemplary embodiments as a result of the description made with reference thereto, but instead the invention encompasses any novel feature and any combination of features, including in particular any combination of features in the claims, even if these features or these combinations are not themselves explicitly indicated in the claims or exemplary embodiments.

The invention claimed is:

1. A method for producing an optoelectronic semiconductor component, the method comprising:
   providing a semiconductor chip that comprises an active layer configured to generate radiation;
   providing a carrier substrate that comprises a mounting region for the semiconductor chip and a first opening, which is formed in the mounting region of the carrier substrate;
   mounting the semiconductor chip on the mounting region of the carrier substrate;
   applying an electrically insulating layer to a side of the carrier substrate remote from the semiconductor chip in such a way that the electrically insulating layer completely fills the first opening in the carrier substrate;
   forming a second opening in the electrically insulating layer, the second opening being formed in a region of the first opening in the carrier substrate; and
   applying an electrically conductive layer on a side of the electrically insulating layer remote from the carrier substrate in such a way that the electrically conductive layer fills the second opening in the electrically insulating layer in the form of a via,
   wherein the semiconductor chip comprises two mutually electrically insulated electrical contact regions on the side facing the carrier substrate, the first and second openings being formed in a region vertically adjacent to one of the two contact regions, and
   wherein a diameter of the first opening is larger than a diameter of the adjacent contact region and a diameter of the second opening is smaller or equal to a diameter of the adjacent contact region.

2. The method according to claim 1, wherein the first opening has a diameter of at least 70 µm and at most 90 µm and the second opening has a diameter of at least 10 µm and at most 30 µm.

3. The method according to claim 1, wherein the second opening is formed at least in part in the first opening.

4. The method according to claim 1, wherein the via is punctiform.

5. The method according to claim 1, further comprising patterning the electrically conductive layer.

6. The method according to claim 1, further comprising roughening an outcoupling face of the semiconductor chip, which is on the opposite side from the carrier substrate, after applying the electrically conductive layer.

7. The method according to claim 1, further comprising applying a converter layer and/or a passivation layer to the opposite side of the semiconductor chip from the carrier substrate after applying the electrically conductive layer.

8. The method according to claim 1, further comprising thinning or completely detaching a growth substrate of the semiconductor chip.

9. The method according to claim 1, wherein a plurality of semiconductor chips is provided, wherein the carrier substrate comprises a plurality of mounting regions for the semiconductor chips and a plurality of first openings, wherein each of the semiconductor chips is arranged on a corresponding one of the mounting regions and wherein a plurality of second openings is formed in the electrically insulating layer, one of the second openings being formed in the region of a corresponding one of the first openings in the carrier substrate.

10. The method according to claim 9, further comprising singulating the semiconductor component is singulated into individual semiconductor chips and/or into semiconductor chip modules.

11. The method according to claim 9, wherein mounting the semiconductor chip comprises applying the semiconductor chips to the mounting regions of the carrier substrate using a pick-and-place method.

12. A method for producing an optoelectronic semiconductor component, the method comprising:
   A1) providing a semiconductor chip that comprises an active layer configured to generate radiation;
   A2) providing a carrier substrate which comprises a mounting region for the semiconductor chip and a first opening, which is formed in the mounting region of the carrier substrate;
   B) mounting the semiconductor chip on the mounting region of the carrier substrate;
   C) applying an electrically insulating layer to a side of the carrier substrate remote from the semiconductor chip in such a way that the electrically insulating layer completely fills the first opening in the carrier substrate;
   D) forming a second opening in the electrically insulating layer, the second opening being formed in a region of the first opening in the carrier substrate; and
   E) applying an electrically conductive layer on a side of the electrically insulating layer remote from the carrier substrate in such a way that the electrically conductive layer fills the second opening in the electrically insulating layer in the form of a via, wherein the method steps B) to E) are performed in the claimed sequence.

* * * * *